United States Patent
Seya

(10) Patent No.: US 6,873,216 B2
(45) Date of Patent: Mar. 29, 2005

(54) CHATTERING ELIMINATING APPARATUS INCLUDING OSCILLATION CIRCUIT USING CHARGING AND DISCHARGING OPERATIONS

(75) Inventor: Shunichi Seya, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/269,248

(22) Filed: Oct. 11, 2002

(65) Prior Publication Data

US 2003/0076182 A1 Apr. 24, 2003

(30) Foreign Application Priority Data

Oct. 18, 2001 (JP) ........................................ 2001-320792

(51) Int. Cl.[7] .............................................. H03B 1/00
(52) U.S. Cl. ...................... 331/74; 331/143; 361/203; 327/385; 327/379
(58) Field of Search .................. 331/74, 143; 327/385, 327/379; 361/203

(56) References Cited

FOREIGN PATENT DOCUMENTS

| JP | A-2-162821 | 6/1990 |
|---|---|---|
| JP | A-4-274613 | 9/1992 |
| JP | A-5-83093 | 4/1993 |

*Primary Examiner*—Arnold Kinkead
(74) *Attorney, Agent, or Firm*—Scully, Scott, Murphy & Presser

(57) ABSTRACT

In a chattering eliminating apparatus, a coincidence circuit receives an input signal of the apparatus and an output signal of the apparatus to determine whether or not a level of the input signal of the apparatus is the same as a level of the output signal of the apparatus. An oscillation circuit carries out an oscillation operation only when the level of the input signal of the apparatus is not the same as the level of the output signal of the apparatus. A counter counts an output signal of the oscillation circuit, and is reset when the level of the input signal of the apparatus is the same as the level of the output signal of the apparatus. An output signal generating circuit inverts the level of the output signal of the apparatus when a counter value of the counter reaches a predetermined value.

11 Claims, 12 Drawing Sheets

Fig. 10

| | STATE | S1 | S3 | MOS212/216 | MOS213/214 |
|---|---|---|---|---|---|
| I | RAPID DISCHARGE | HIGH | – | OFF/ON | – |
| II | CHARGE | LOW | LOW | ON/OFF | ON/OFF |
| III | DISCHARGE | LOW | HIGH | ON/OFF | OFF/ON |

CHATTERING ELIMINATING APPARATUS INCLUDING OSCILLATION CIRCUIT USING CHARGING AND DISCHARGING OPERATIONS

BACKGROUND OF THE INVENTION

1. Field of the Invention

The present invention relates to a chattering eliminating apparatus.

2. Description of the Related Art

In an electric apparatus including a contact switch and a control apparatus receiving the output signal of the contact switch, when the contact switch is turned ON and OFF alternately for very short times, the control apparatus may erroneously operate due to a chattering phenomenon in the output signal of the contact switch.

In order to prevent the control apparatus from erroneously operating due to the chattering phenomenon, a chattering eliminating apparatus is inserted between the contact switch and the control apparatus.

A first prior art chattering eliminating apparatus (see: JP-A-2-162821) is constructed by a charging/discharging circuit for charging/discharging a capacitor in accordance with an input signal and a comparator for comparing the voltage of the capacitor with a reference voltage. This will be explained later in detail.

In the above-described first prior art chattering eliminating apparatus, however, it is impossible to completely eliminate the chattering phenomenon when the input signal has a duty ratio of much larger than 50% or much smaller than 50%. Also, in order to completely eliminate the chattering phenomenon, the capacitance of the capacitor has to be larger, which would increase the size of the apparatus.

A second prior art chattering apparatus (see: JP-A-5-83093) is constructed by an exclusive OR circuit for detecting a chattering phenomenon in an input signal, a monostable (one-shot) multivibrator triggered by a rising edge of the output signal of the exclusive OR circuit, a T-type flip-flop triggered by a training edge of the output signal of the one-shot multivibrator, and a D-type flip-flop for fetching the output signal of the T-type flip-flop in synchronization with a rising edge of the output signal of the one-shot multivibrator. The output signal of the T-type flip-flop is fed back to the exclusive OR circuit. This also will be explained later in detail.

In the above-described second prior art chattering eliminating apparatus, however, since the one-shot multivibrator is usually constructed by a differential circuit, the one-shot multivibrator, i.e., the chattering eliminating apparatus is subjected to noise.

A third prior art chattering eliminating apparatus (see: JP-A-4-274613) is constructed by an exclusive OR circuit for receiving an input signal and an output signal to generate a reset signal, a counter which is reset by the reset signal and is counted down by receiving a clock signal and an initial value, and a D-type flip-flop for generating the output signal. The D-type flip-flop fetches the output signal in synchronization with a carry signal generated for the counter. This also will be explained later in detail.

In the above-describe third prior art chattering eliminating apparatus, however, since there is no capacitor for absorbing noise, the chattering eliminating apparatus is subjected to noise.

SUMMARY OF THE INVENTION

It is an objection of the present invention to provide a chattering eliminating apparatus capable of decreasing the size and being not subjected to the duty ratio of a chattering phenomenon and noise.

According to the present invention, in a chattering eliminating apparatus, a coincidence circuit receives an input signal of the apparatus and an output signal of the apparatus to determine whether or not a level of the input signal of the apparatus is the same as a level of the output signal of the apparatus. An oscillation circuit carries out an oscillation operation only when the level of the input signal of the apparatus is not the same as the level of the output signal of the apparatus. A counter counts an output signal of the oscillation circuit) and is reset when the level of the input signal of the apparatus is the same as the level of the output signal of the apparatus. An output signal generating circuit inverts the level of the output signal of the apparatus when a counter value of the counter reaches a predetermined value.

BRIEF DESCRIPTION OF THE DRAWINGS

The present invention will be more clearly understood from the description set forth below, as compared with the prior art, with reference to the accompanying drawings, wherein:

FIG. 10 is a table for explaining the operation of the charging/discharging circuit of FIG. 9;

DESCRIPTION OF THE PREFERRED EMBODIMENT

Before the description of the preferred embodiment, prior art chattering eliminating apparatuses will be explained with reference to FIGS. 1, 2, 3, 4, 5, 6, 7 and 8.

Figure 1:
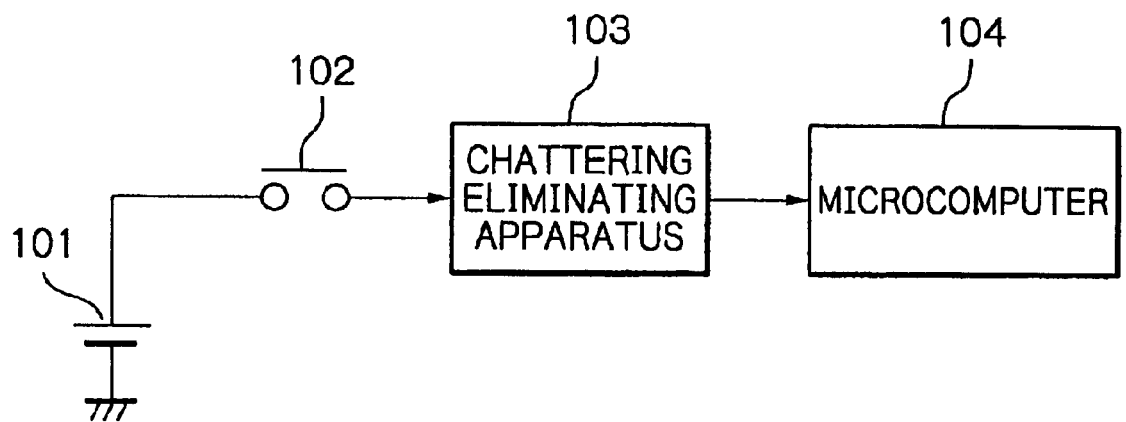
FIG. 1 is block circuit diagram illustrating an electric apparatus including a chattering eliminating apparatus.

In FIG. 1, which illustrates an electric apparatus such as an automobile controlling apparatus, reference numeral 101 designates a battery connected to an ignition switch 102. The ignition switch 102 is connected via a chattering eliminating apparatus 103 to a microcomputer 104. That is, when the ignition switch 102 is turned ON and OFF alternately for very shot times, a chattering phenomenon may occur. Therefore, if the output signal of the ignition switch 102 including such a chattering phenomenon is supplied directly to the microcomputer 104, the microcomputer 104 may erroneously operate. In order to prevent the microcomputer 104 from erroneously operating, the chattering eliminating apparatus 104 is provided between the ignition switch 103 and the microcomputer 104.

Figure 2:
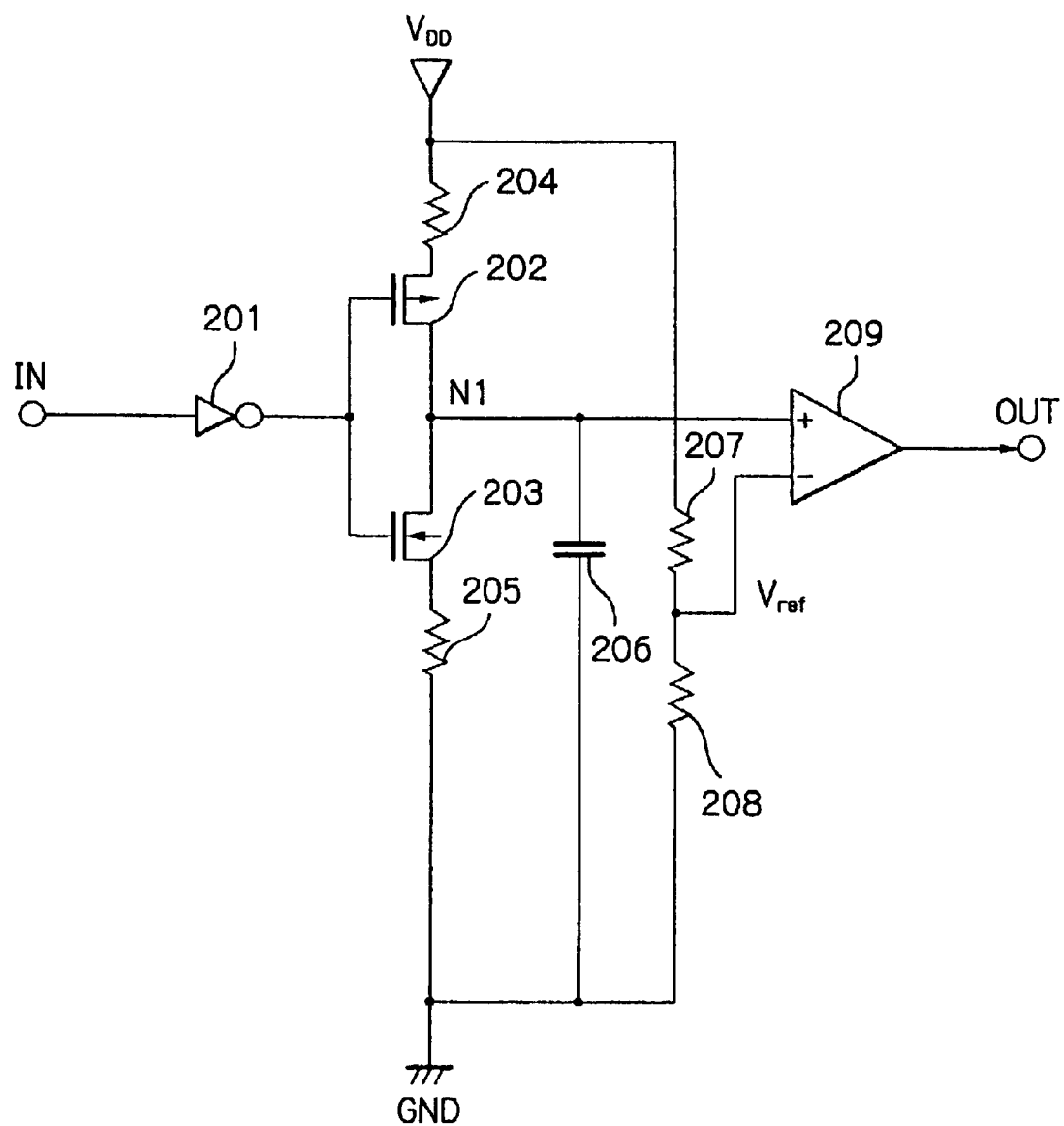
FIG. 2 is a circuit diagram illustrating a first prior art chattering eliminating apparatus.

In FIG. 2, which illustrates a first chattering eliminating apparatus (see: JP-A-2-162821), an inverter 201 receives an input signal IN and supplies its output signal to the gates of a P-channel MOS transistor 202 and an N-channel transistor 203 connected in series between a power supply terminal $V_{DD}$ and a ground terminal GND. In this case, the P-channel MOS transistor 202 along with a charging resistor 204 is connected between the power supply terminal $V_{DD}$ and a node N1, while the N-channel MOS transistor 203 along with a discharging resistor 205 is connected between the node N1 and the ground terminal GND. Also, a capacitor 206 is connected to the node N1. On the other hand, a voltage divider formed by resistors 207 and 208 is connected between the power supply terminal $V_{DD}$ and the ground terminal GND to generate a reference voltage $V_{ref}$. A comparator 209 compares a voltage at the node N1 with the reference voltage $V_{ref}$ to generate an output signal OUT. In this case, a charging time constant determined by the ON resistance of the P-channel MOS transistor 202 and the resistance of the resistor 204 for the capacitor 206 is substantially the same as a discharging time constant determined by the ON resistance of the N-channel MOS transistor 203 and the resistance of the resistor 205 for the capacitor 206.

The operation of the chattering eliminating apparatus of FIG. 2 is explained next with reference to FIGS. 3 and 4.

Figure 3:
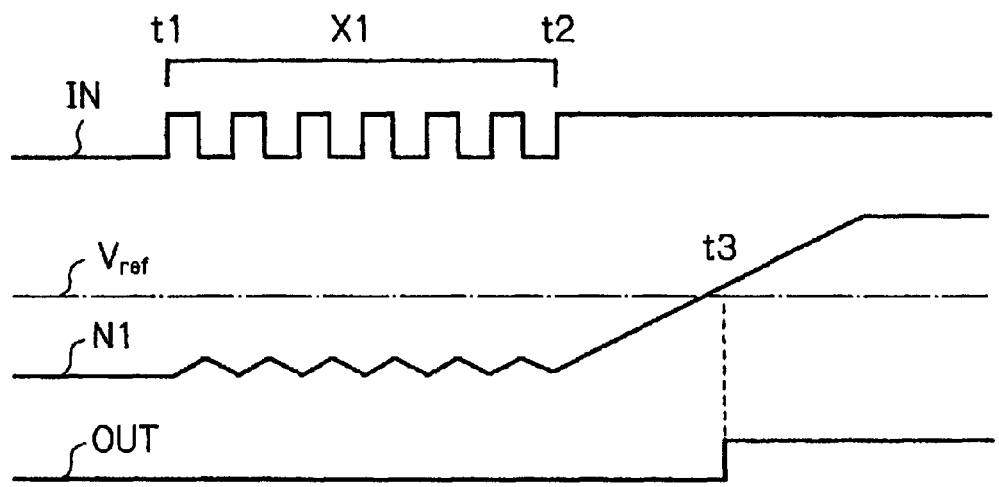
FIGS. 3 and 4 are timing diagrams for explaining the operation of the chattering eliminating apparatus of FIG. 2.

In FIG. 3, when the input signal IN rises, it is assumed that a chattering phenomenon X1 having a duty ratio of about 50% occurs in the input signal IN from time t1 to time t2. In this case, during a time from t1 to t2, the MOS transistors 202 and 203 are turned ON and OFF alternately; however, the voltage at the node N1 does not reach the reference voltage $V_{ref}$, so that the output signal OUT is never changed. Then, at time t3, after the chattering phenomenon X1 is completed, the voltage at the node N1 reaches the reference voltage $V_{ref}$, so that the comparator 209 changes the output signal OUT from low to high. Thus, the chattering phenomenon X1 is completely eliminated.

Similarly, even when the above-mentioned chattering phenomenon having a duty ratio of about 50% occurs in the input signal IN while the input signal IN is falling, this chattering phenomenon is completely eliminated.

Figure 4:
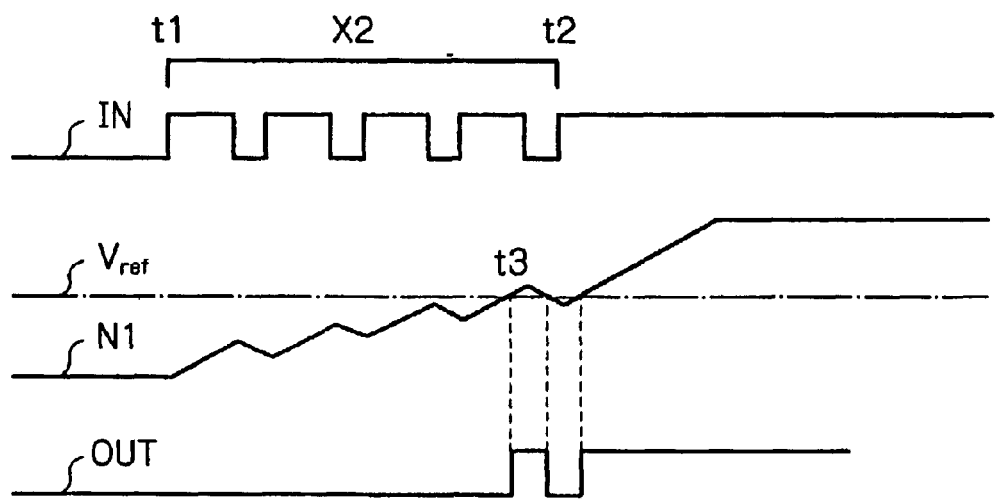

In FIG. 4, when the input signal IN rises, it is assumed that a chattering phenomenon X2 having a duty ratio of much larger than 50% occurs in the input signal IN from time t1 to time t2. In this case, during a time from t1 to t2, the MOS transistors 202 and 203 are turned ON and OFF alternately; however, the voltage at the node N1 reaches the reference voltage $V_{ref}$ at time t3 before time t2, so that the output signal OUT is changed. Thus, the chattering phenomenon X2 is incompletely eliminated.

On the other hand, when a chattering phenomenon having a duty ratio of much smaller than 50% occurs in the input signal IN while the input signal IN is falling, this chattering phenomenon is also incompletely eliminated.

In order to completely eliminate the chattering phenomenon having a duty ratio of much larger than 50% or much smaller than 50%, one approach is to change the threshold voltage $V_{ref}$ for a rising input signal IN and a falling input signal IN. For example, when the input signal IN is rising, the thresold voltage $V_{ref}$ is made higher. On the other hand, when the input signal IN is falling, the threshold voltage $V_{ref}$ is made lower. In this case, however, the control therefor is complex, and it is difficult to completely eliminate the chattering phenomenon when the input signal IN greatly fluctuates.

Also, in the chattering eliminating apparatus of FIG. 2, in order to completely eliminate the chattering eliminating apparatus, the capacitance of the capacitor 206 has to be larger, which would increase the size of the chattering eliminating apparatus of FIG. 2.

Figure 5:
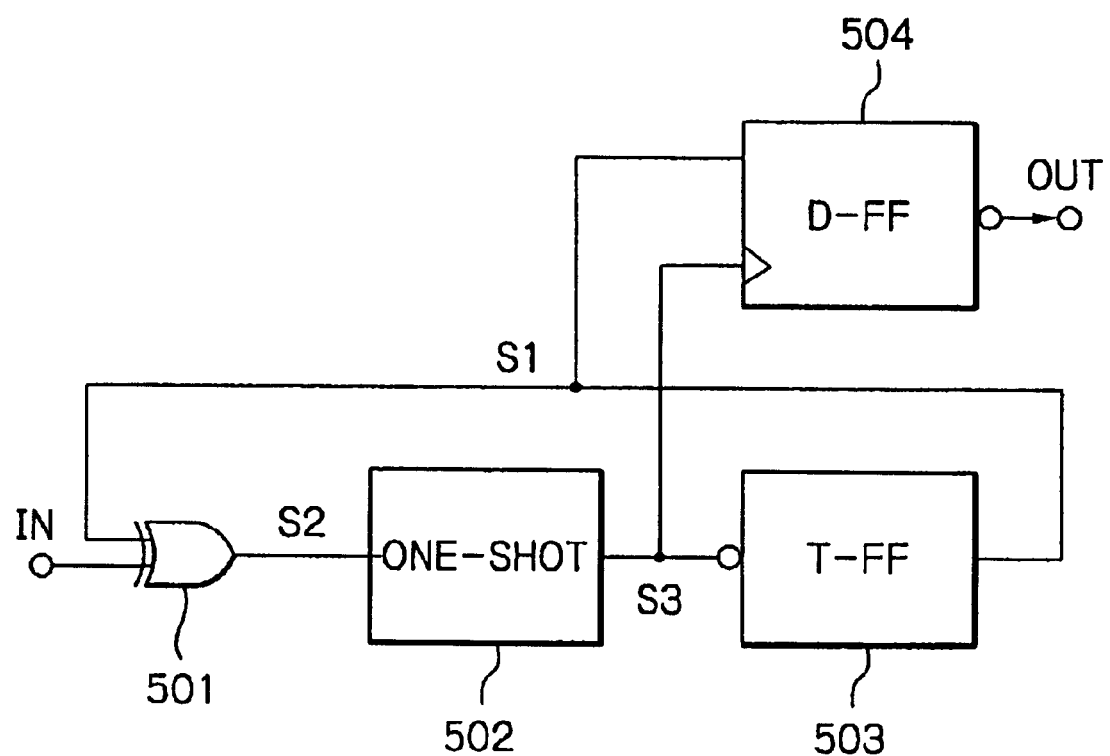
FIG. 5 is a circuit diagram illustrating a second prior art chattering eliminating apparatus.

In FIG. 5, which illustrates a second prior art chattering eliminating apparatus (see: JP-A-5-83093), an exclusive OR circuit 501 receives an input signal IN and a signal S1 to generate a signal S2 which is high when the level of the input signal IN is different from that of the signal S1. The output signal S2 of the exclusive OR circuit 501 triggers a monostable (one-shot) multivibrator 502, so that the one-shot multivibrator 502 generates an output signal S3 having a duration of T when the output signal S2 of the exclusive OR circuit 501 rises. The output signal S3 of the one-shot multivibrator 502 triggers a T-type flip-flop 503, so that the output signal S1 of the T-type flip-flop 503 is switched by a training edge of the output signal S3 of the one-shot multivibrator 502. The output signal S1 of the T-type flip-flop 503 is fed back to the exclusive OR circuit 501. A D-type flip-flop 504 fetches the output signal S1 of the T-type flip-flop 503 in sychronization with a rising edge of the output signal S3.

The operation of the chattering eliminating apparatus of FIG. 5 is explained next with reference to FIG. 6.

Figure 6:
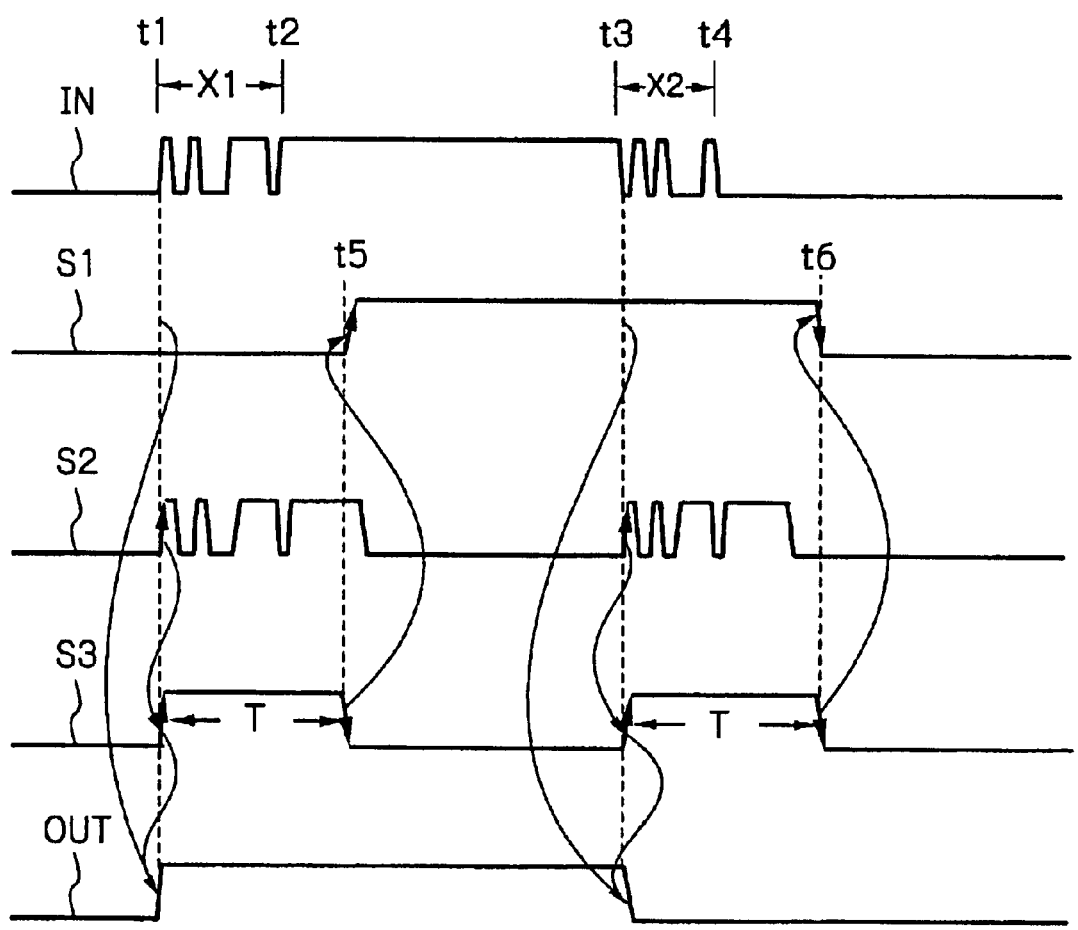
FIG. 6 is a timing diagram for explaining the operation of the chattering eliminating apparatus of FIG. 5.

In FIG. 6, it is assumed that the input signal IN has a chattering phenomenon X1 from time t1 to time t2 and a chattering phenomenon X2 from time t3 to time t4.

First, at time t1, when the output signal S2 of the exclusive OR circuit 501 rises, the one-shot multivibrator 502 is triggered to raise its output signal S3, so that the D-type flip-flop 504 fetches the output signal S1 of the T-type flip-flop 503 which is, in this case, low. As a result, the output signal OUT is changed from low to high.

Next, after the duration T has passed, at time t5, the output signal S3 of the one-shot multivibrator 502 is changed from high to low, so that the output signal S1 of the T-type flip-flop 503 is changed from low to high.

Next, at time t3, when the output signal S2 of the exclusive OR circuit 501 rises, the one-shot multivibrator 502 is triggered to raise its output signal S3, so that the D-type flip-flop 504 fetches the output signal S1 of the T-type flip-flop 503 which is, in this case, high. As a result, the output signal OUT is changed from high to low.

Next, after the duration T has passed, at time t6, the output signal S3 of the one-shot multivibrator 502 is changed from high to low, so that the output signal S1 of the T-type flip-flop 503 is changed from high to low.

Thus, the chattering phenomena X1 and X2 whose durations are smaller than T are completely eliminated.

In the chattering eliminating apparatus of FIG. 5, however, since the one-shot multivibrator 502 is usually constructed by a differential circuit, the one-shot multivibrator 502, i.e., the chattering eliminating apparatus of FIG. 5 is subjected to noise.

Figure 7:
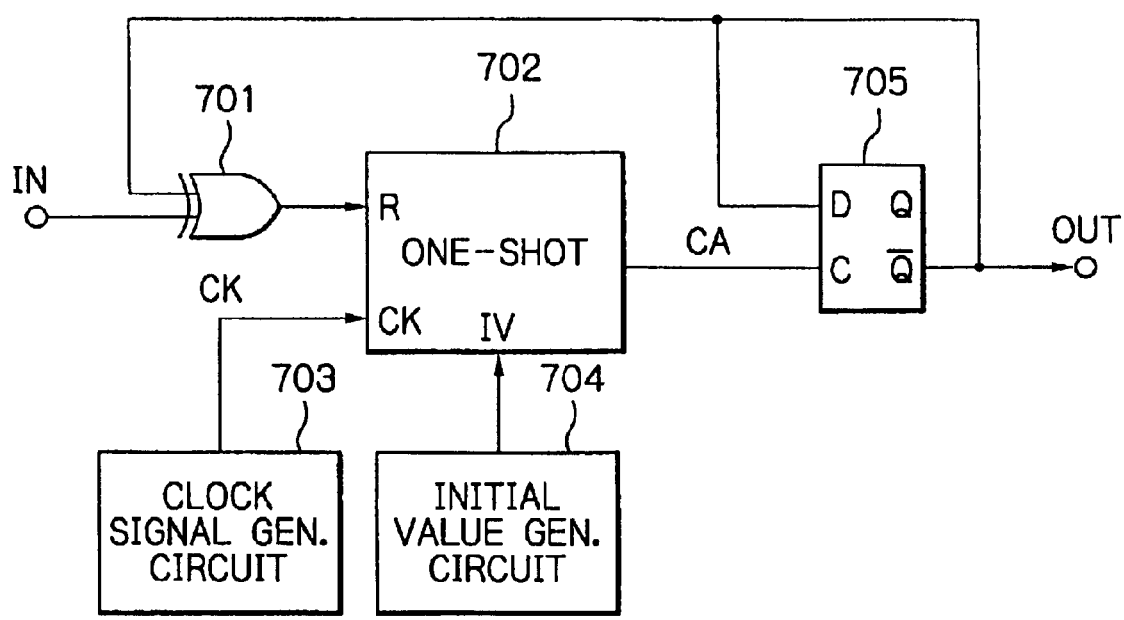
FIG. 7 is a circuit diagram illustrating a third prior art chattering eliminating apparatus.

In FIG. 7, which illustrates a third prior art chattering eliminating apparatus (see: JP-A-4-274613), an exclusive OR circuit 701 receives an input signal IN and an output signal OUT of the apparatus to generate an output signal R. The output signal R of the exclusive OR circuit 701 is supplied as a reset signal to a counter 702 which receives a clock signal CK from a clock signal generating circuit 703 and an initial value IV from an initial value generating circuit 704. When the value of the counter 702 exceeds the initial value IV, the counter 702 generates a carry signal CA and transmits it to a D-type flip-flop 705. As a result, the D-type flip-flop 705 fetches the output signal OUT in synchronization with the carry signal CA of the counter 702.

The operation of the chattering eliminating apparatus of FIG. 7 is explained next with reference to FIG. 8.

Figure 8:
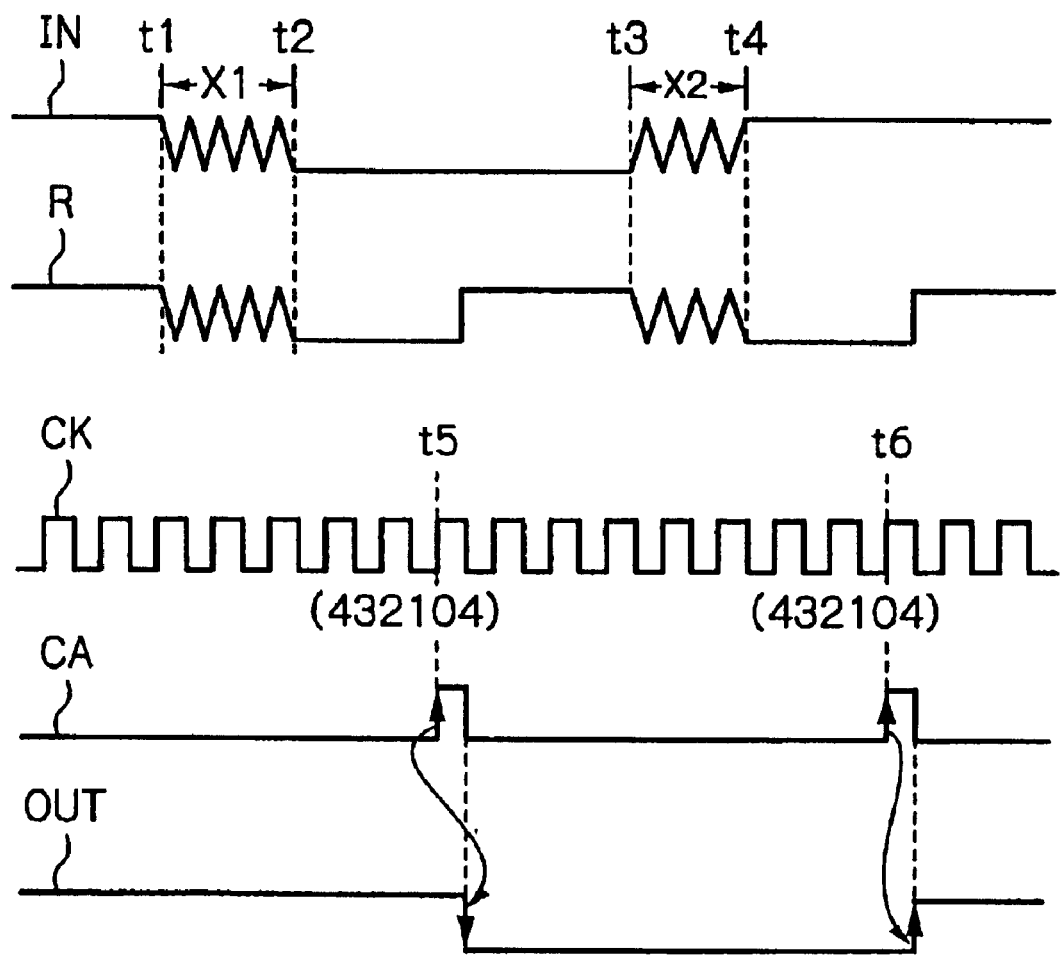
FIG. 8 is a timing diagram for explaining the operation of the chattering eliminating apparatus of FIG. 7.

In FIG. 8, it is assumed that the input signal IN has a chattering phenomenon X1 from time t1 to time t2 and a chattering phenomenon X2 from time t3 to time t4. Also, the initial value IV is set to be 4.

During a time from time t1 to time t2, the counter 702 is being reset by the reset signal R due to the chattering phenomenon X1, so that the value of the counter 702 remains at 4.

Next, at time t2, when the chattering phenomenon X1 is completed, the counter 702 is counted down by receiving the clock signal CK.

Next, at time t5, when the value of the counter 702 reaches 0, the counter 702 generates a carry signal CA, so that the D-type flip-flop 705 fetches the output signal OUT which is, in this case, high. As a result, the output signal OUT is changed from high to low.

Next, during a time from time t3 to time t4, the counter 702 is being reset by the reset signal R due to the chattering phenomenon X2, so that the value of the counter 702 remains at 4.

Next, at time t4, when the chattering phenomenon X2 is completed, the counter 702 is counted down by receiving the clock signal CK.

Next, at time t6, when the value of the counter 702 reaches 0, the counter 702 generates a carry signal CA, so that the D-type flip-flop 705 fetches the output signal OUT which is, in this case, low. As a result, the output signal OUT is changed from low to high.

Thus, the chattering phenomena X1 and X2 are completely eliminated.

In the chattering eliminating apparatus of FIG. 7, however, since there is no capacitor for absorbing noise, the chattering eliminating apparatus of FIG. 7 is subjected to noise.

Figure 9:
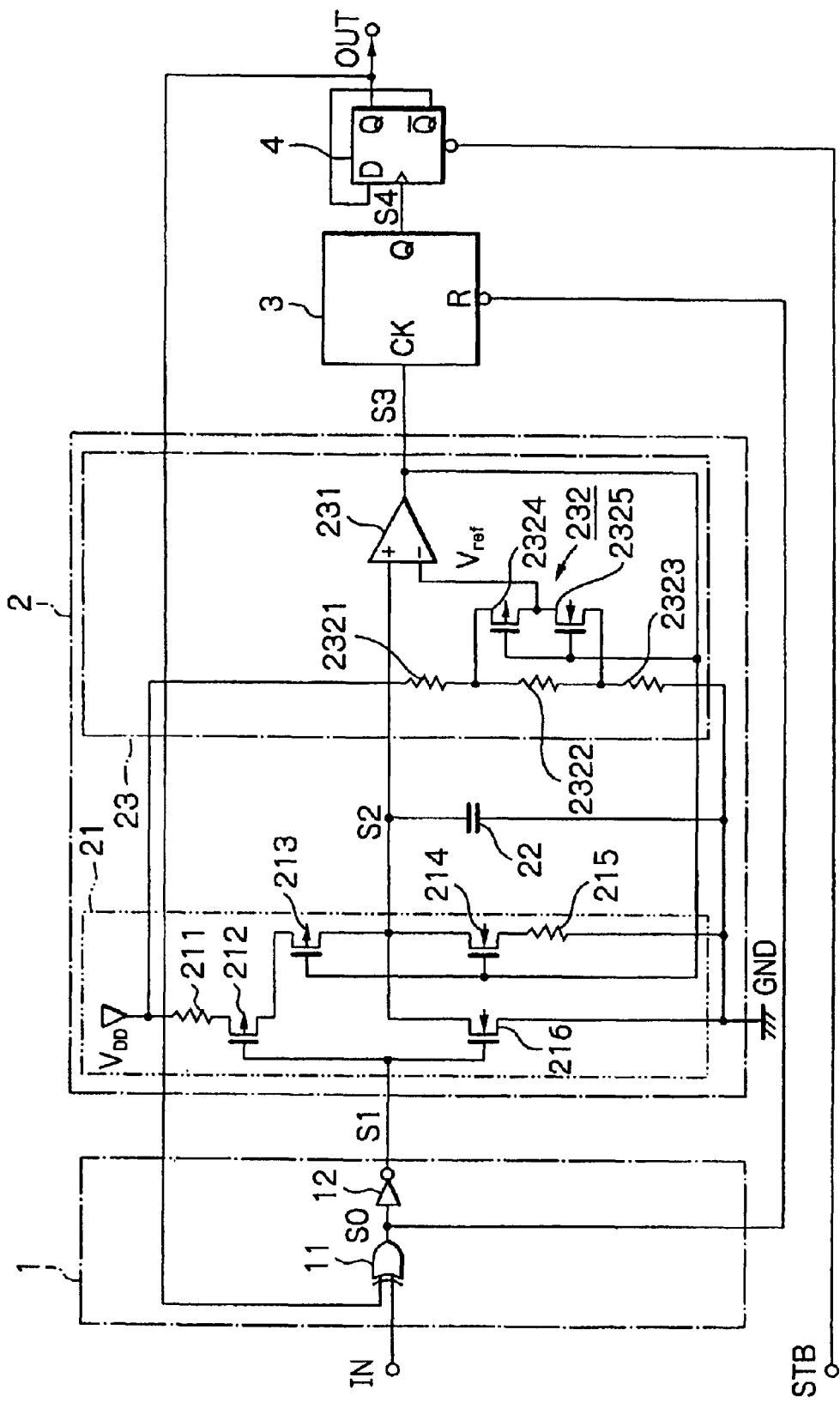
FIG. 9 is a circuit diagram illustrating an embodiment of the chattering eliminating apparatus according to the present invention.

In FIG. 9, which illustrates an embodiment of the chattering eliminating apparatus according to the present invention, reference numeral 1 designates a coincidence circuit 1 for comparing an input signal IN with an output signal OUT, 2 designates an oscillation circuit formed by a charging/discharging circuit 21 for charging/discharging a capacitor 22 in accordance with the output signal S1 of the coincidence circuit 1 and a comparator 23 for comparing the output signal S2 of the capacitor 22 with a variable reference voltage $V_{ref}$, 3 designates a counter for counting the output signal S3 of the oscillation circuit 2, and 4 designates a D-type flip-flop operated by the carry-over signal S4 of the counter 3 to generate the output signal OUT. The charging/discharging operations of the charging/discharging circuit 21 and the reference voltage $V_{ref}$ are controlled by the output signal S3 of the comparator circuit 23, i.e., the oscillation circuit 2.

The coincidence circuit 1 is constructed by an exclusive OR circuit 11 and an inverter 12. When the level of the input signal IN coincides with that the output signal OUT, the output signal S0 of the exclusive OR circuit 11 is "0" (low). On the other hand, when the level of the input signal IN does not coincide with that the output signal OUT, the output signal S0 of the exclusive OR circuit 11 is "1" (high).

The output signal S0 of the exclusive OR circuit 11 is supplied to the counter 3, so that the counter 3 is reset by a training edge of the output signal S0 of the exclusive OR circuit 11. Also, the output signal S1 of the inverter 12, i.e., the coincidence circuit 1 is supplied to the charging/discharging circuit 21.

The charging/discharging circuit 21 is constructed by a charging circuit formed by a resistor 211 and P-channel MOS transistors 212 and 213 between a power supply terminal $V_{DD}$ and the terminal of the capacitor 22, a discharging circuit formed by an N-channel MOS transistor 214 and a resistor 215 between the terminal of the capacitor 22 and the ground terminal GND, and an N-channel MOS transistor 216 for rapidly discharging the capacitor 22. That is, when the level of the output signal S1 of the coincidence circuit 1 is "1" (high) (see: I of FIG. 10), the transistor 216 is turned ON, so that the charging/discharging operation of the charging/discharging circuit 21 is substantially stopped. On the other hand, when the output signal S1 of the coincidence circuit 1 is "0" (low), the charging circuit or the discharging circuit is operated in accordance with the level of the output signal S3 of the comparator circuit 23. For example, when the output signal S3 of the comparator circuit 23 is "0" (low) (see: II of FIG. 10), the transistors 213 and 214 are turned ON and OFF, respectively, so that the capacitor 22 is charged by a time constant determined by the resistance value of the resistor 211, the ON-resistance value of the transistors 212 and 213, and the capacitance value of the capacitor 22. Also, when the output signal S3 of the comparator circuit 23 is "1" (high) (see: III of FIG. 10), the transistors 213 and 214 are turned OFF and ON, respectively, so that the capacitor 22 is discharged by a time constant determined by the resistance value of the resistor 215, the ON-resistance value of the transistor 214, and the capacitance value of the capacitor 22.

The comparator circuit 23 is constructed by a comparator 231 and a reference voltage generating circuit 232 for generating the variable reference voltage $V_{ref}$. Also, the reference voltage generating circuit 232 is formed by voltage-dividing resistors 2321, 2322 and 2323, and a P-channel MOS transistor 2324 and an N-channel MOS transistor 2325 between the terminals of the resistor 2322.

Figure 11:
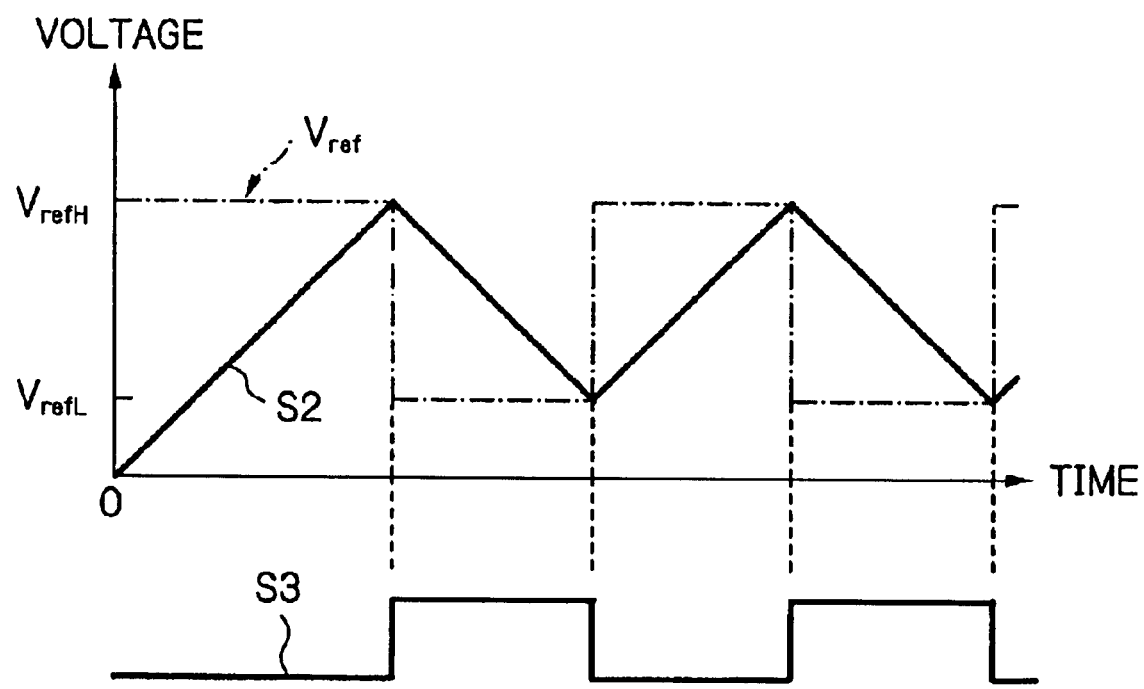
FIG. 11 is a timing diagram for explaining the operation of the changing/discharging circuit, the capacitor and the comparator circuit of FIG. 9.

The transistors 2324 and 2325 are controlled by the output signal S3 of the comparator 231. That is, when the output signal S3 of the comparator 231 is "0" (low), the transistors 2324 and 2325 are turned ON and OFF, respectively, so that the reference voltage $V_{ref}$ is increased to $V_{refH}$. On the other hand, when the output signal S3 of the comparator 231 is "1" (high), the transistors 2324 and 2325 are turned OFF and ON, respectively, so that the reference voltage $V_{ref}$ is increased to $V_{refL}$. Thus, the comparator circuit 23 is of a window type which has a hysteresis characteristic where a blind zone is formed between $V_{refH}$ and $V_{refL}$. As a result, the charging/discharging circuit 21, the capacitor 22 and the comparator circuit 23 are operated so that the output signal S2 of the capacitor 22, the reference voltage $V_{ref}$ and the output signal S3 of the comparator circuit 23 are changed as shown in FIG. 11, thus carrying out an oscillation operation.

The counter 3 is reset by a trailing edge of the output signal S0 of the exclusive OR circuit 11 or a rising edge of the output signal 81 of the inverter 12. When the counter value of the counter 3 reaches a predetermined value such as 4, the counter 3 generates the carry-over signal S4.

The D-type flip-flop 4 fetches its inverted output signal in synchronization with the carry-over signal S4 of the counter 3. As a result, the output signal OUT of the D-type flip-flop 4 is inverted upon receipt of the carry-over signal S4. Note that the D-type flip-flop 4 is reset by an initialization signal STB.

A first operation of the chattering eliminating apparatus of FIG. 9 is explained next with reference to FIG. 12, where the input signal IN rises with no chattering phenomenon.

Before time t1, the input signal IN and the output signal OUT are both "0" (low). Therefore, the output signals S0 and S1 of the exclusive OR circuit It and the inverter 12 are "0" (low) and "1" (high), respectively. As a result, the capacitor 22 is rapidly discharged by the ON transistor 216 so that its output signal S2 is "0" (high) while the reference voltage $V_{ref}$ remains at $V_{refH}$. Also, the counter value of the counter 3 remains at 0.

Next, at time t1, when the input signal IN rises, the output signals S0 and S1 of the exclusive OR circuit 11 and the inverter 12 are made "1" (high) and "0" (low), respectively. As a result, the charging circuit (211, 212, 213) initiates to charge the capacitor 22, so that the level of the output signal S2 is increased.

Next, at time t2, when the output signal S2 of the capacitor 22 reaches the reference voltage $V_{refH}$, the output signal S3 of the comparator circuit 23 is switched from "0" (low) to "1" (high). As a result, the counter value of the counter 3 is increased from "0" to "1". Simultaneously, the discharging circuit (214, 215) initiates to discharge the capacitor 22 while the reference voltage $V_{Vef}$ is switched from $V_{refH}$ to $V_{refL}$ Next, at time t3, when the output signal S2 of the capacitor 22 reaches the reference voltage $V_{refL}$, the output signal S3 of the comparator circuit 23 is switched from "1" (high) to "0" (low). As a result, the charging circuit (211, 212, 213) initiates to charge the capacitor 22 while the reference voltage $V_{Vef}$ is switched from $V_{refL}$ to $V_{refH}$.

Subsequently, at times t4, t5, t6 and t7, the same discharging and charging operations are repeated.

Finally, at time t8, when the output signal S2 of the capacitor 22 reaches the reference voltage $V_{refH}$, the counter value of the counter 3 reaches the predetermined value such as 4, so that the counter 3 generates a carry-over signal S4, thus inverting the content of the D-type flip-flop 4 which is the output signal OUT. In this case, the output signal OUT is switched from "0" (low) to "1" (high).

When the output signal OUT is switched from "0" (low) to "1" (high), the output signal S0 of the exclusive OR circuit 11 falls and the output signal S1 of the inverter 12 rises. As a result, the transistor 216 is turned ON to rapidly discharge the capacitor 22, thus stopping the oscillation operation of the oscillation circuit 2.

Figure 12:
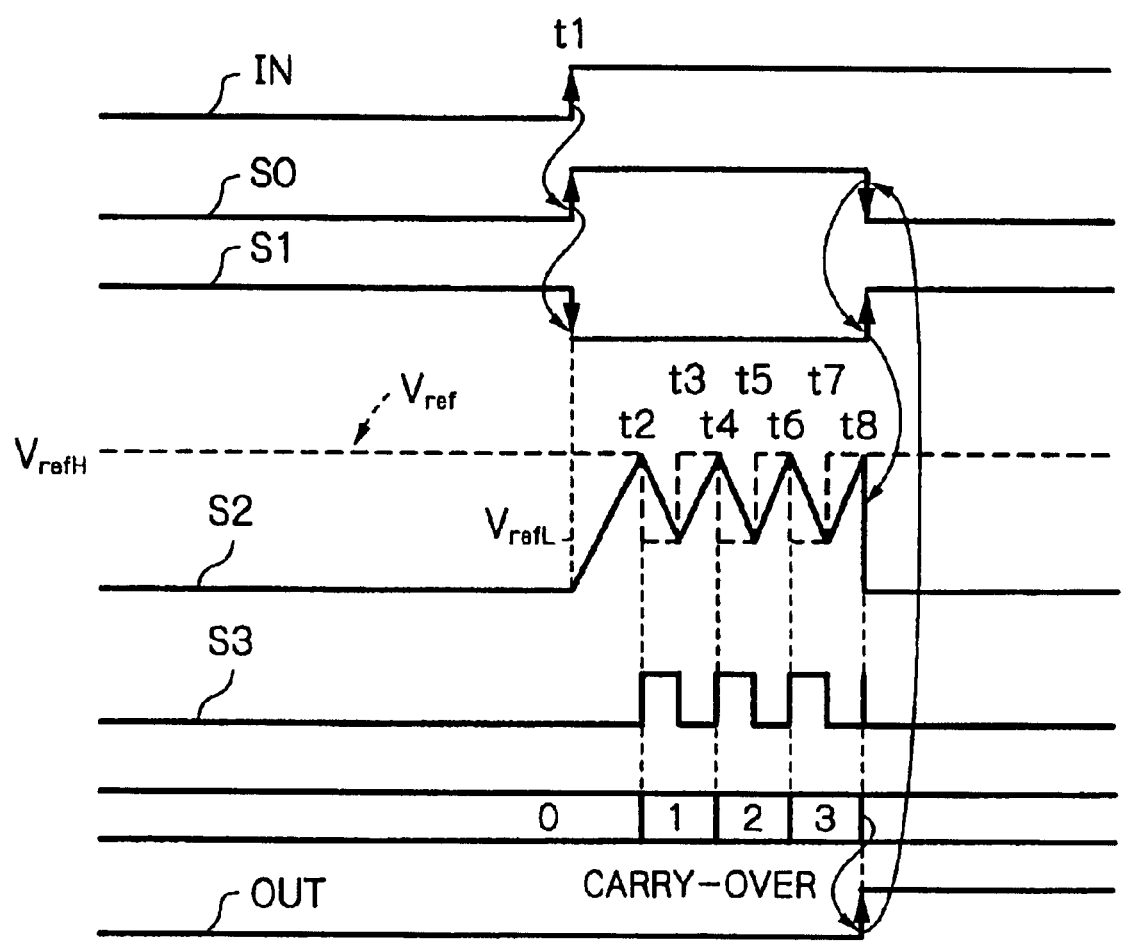
FIGS. 12 and 13 are timing diagrams for explaining the operation of the chattering eliminating apparatus of FIG. 9.

When the input signal IN falls with no chattering phenomenon, a similar operation as in FIG. 12 is carried out.

A second operation of the chattering eliminating apparatus of FIG. 9 is explained next with reference to FIG. 13, where the input signal IN rises with a chattering phenomenon as indicated by X.

Before time t1, the input signal IN and the output signal OUT are both "0" (low). Therefore, the output signals S0 and S1 of the exclusive OR circuit 11 and the inverter 12 are "0" (low) and "1" (high), respectively. As a result, the capacitor 22 is rapidly discharged by the ON transistor 216 so that its output signal S2 is "0" (high) while the reference voltage $V_{ref}$ remains at $V_{refH}$. Also, the counter value of the counter 3 remains at 0.

Next, at time t1, when the input signal IN rises, the output signals S0 and S1 of the exclusive OR circuit 11 and the inverter 12 are made "1" (high) and "0" (low), respectively. As a result, the charging circuit (211, 212, 213) initiates to charge the capacitor 22, so that the level of the output signal S2 is increased.

Next, at time t2, when the output signal S2 of the capacitor 22 reaches the reference voltage $V_{refH}$, the output signal S3 of the comparator circuit 23 is switched from "0" (low) to "1" (high). As a result, the counter value of the counter 3 is increased from "0" to "1". Simultaneously, the discharging circuit (214, 215) initiates to discharge the capacitor 22 while the reference voltage $V_{ref}$ is switched from $V_{refH}$ to $V_{refL}$.

Next, at time t3, when the input signal IN falls, the output signal S0 of the exclusive OR circuit 11 falls and the output signal S1 of the inverter 12 rises. As a result, the transistor 216 is turned ON to rapidly discharge the capacitor 22, thus stopping the oscillation operation of the oscillation circuit 2. Simultaneously, the counter value of the counter 3 is reset by the rising edge of the output signal S0 of the exclusive OR circuit 11.

Subsequently, at times t4, t5, t6, t7, t8, t9, t10, t11 and t12, the same charging and discharging operations are repeated; however, since the counter value of the counter 3 does not reach the predetermined value such as 4, the counter 3 never generates a carry-over signal S4, so that the content of the D-type flip-flop 4 is never inverted, i.e., the output signal OUT is never inverted.

Then, during a time period from time t12 to time t13, the same operation as shown in FIG. 12 is carried out, so that the output signal OUT is inverted at time t13.

Thus, the chattering phenomenon X is completely eliminated.

Figure 13:
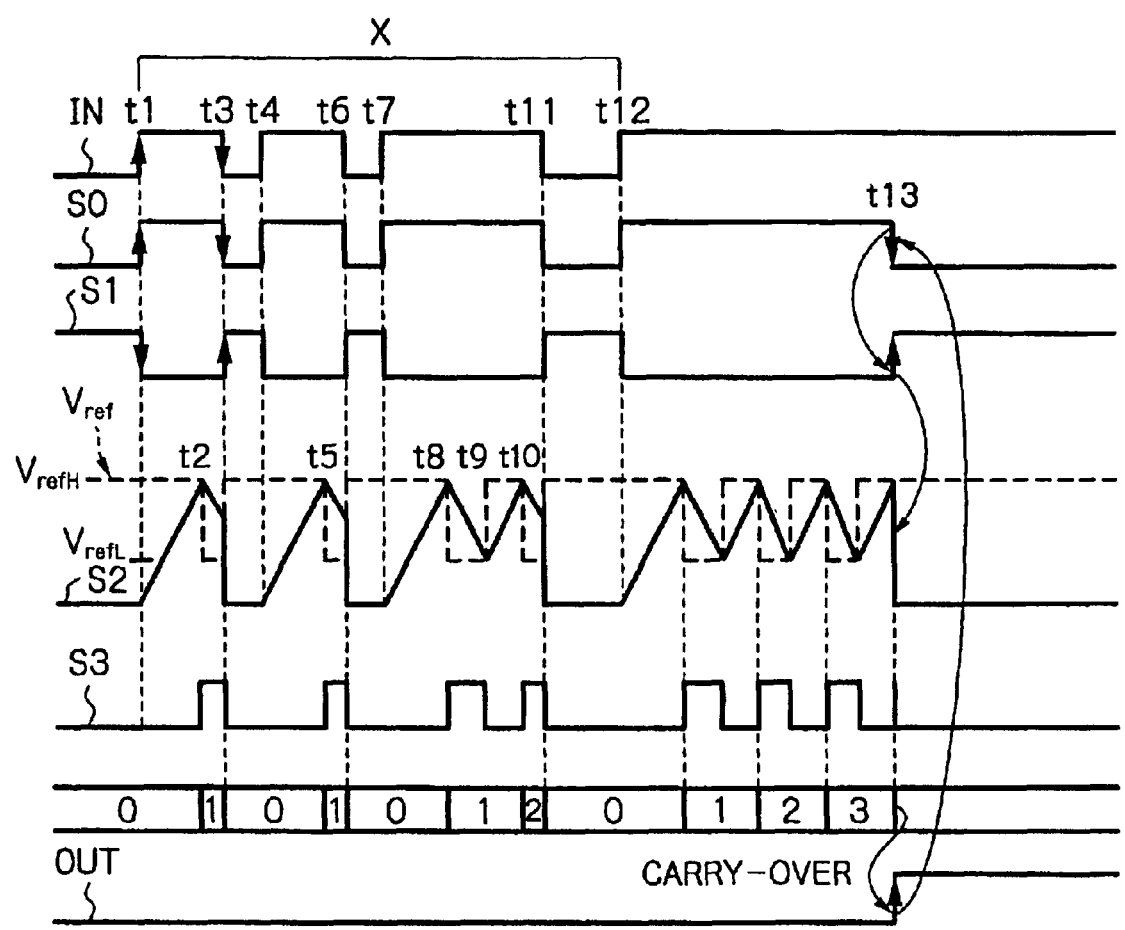

When the input signal IN falls with a chattering phenomenon, a similar operation as in FIG. 13 is carried out.

In the chattering eliminating apparatus of FIG. 9, since the capacitor 22 is used for an oscillation operation, not for counting a duration of a chattering phenomenon, the capacitor 22 can be decreased in size. Note that the duration of a chattering phenomenon is determined mainly by the predetermined value of the counter 3. Also, since the counter 22 is constructed by a digital circuit, the counter 22 can be small in size. Further, the oscillation operation of the oscillation circuit 2 is not subjected to the duty ratio of a chattering phenomenon. Additionally, the capacitor 22 is not subjected to noise.

As explained hereinabove, according to the present invention, the chattering eliminating apparatus can be decreased in size and cannot be subjected to the duty ratio of a chattering phenomenon and noise.

What is claimed is:

1. A chattering eliminating apparatus comprising:
   a coincidence circuit for receiving an input signal of said apparatus and an output signal of said apparatus to determine whether or not a level of the input signal of said apparatus is the same as a level of the output signal of said apparatus;
   an oscillation circuit, connected to said coincidence circuit, for carrying out an oscillation operation only when the level of the input signal of said apparatus is not the same as the level of the output signal of said apparatus;
   a counter, connected to said oscillation circuit, for counting an output signal of said oscillation circuit, said counter being reset when the level of the input signal of said apparatus is the same as the level of the output signal of said apparatus;
   an output signal generating circuit, connected to said counter, for inverting the level of the output signal of said apparatus when a counter value of said counter reaches a predetermined value; and
   wherein said oscillation circuit has a capacitor used to carry out said oscillation operation and said oscillation operation is not subject to a duty ratio of a chattering phenomenon.

2. The apparatus as set forth in claim 1, wherein said coincidence circuit comprises:
   an exclusive OR circuit for receiving the input signal of said apparatus and the output signal of said apparatus; and an inverter, connected to said exclusive OR circuit, for inverting the output signal of said exclusive OR circuit.

3. The apparatus as set forth in claim 1, wherein said oscillation circuit comprises:

a capacitor;

a charging and discharging circuit, connected between said coincidence circuit and said capacitor, for charging and discharging said capacitor when the level of the input signal of said apparatus is not the same as the level of the output signal of said apparatus;

a comparator, connected to said capacitor, for comparing a voltage level of said capacitor with a variable reference voltage; and a reference voltage generating circuit, connected to said comparator, for generating said variable reference voltage in accordance with an output signal of said comparator, said charging and discharging circuit charging and discharging said capacitor in accordance with the output signal of said comparator.

4. The apparatus as set forth in claim 3, wherein, when the output signal of said comparator is a first level, said charging and discharging circuit charges said capacitor and said variable reference voltage is a first reference voltage; and wherein, when the output signal of said comparator is a second level, said charging and discharging circuit discharges said capacitor and said variable reference voltage is a second reference voltage.

5. The apparatus as set forth in claim 3, wherein said charging and discharging circuit comprises:

a charging circuit, connected to said coincidence circuit, said capacitor and said comparator, for charging said capacitor, when the level of the input signal of said apparatus is not the same as the level of the output signal of said apparatus and the output signal of said comparator is a first level;

a discharging circuit, connected to said capacitor and said comparator, for discharging said capacitor, when the level of the input signal of said apparatus is not the same as the level of the output signal of said apparatus and the output signal of said comparator is a second level; and a rapid discharging circuit, connected to said coincidence circuit and said capacitor, for rapidly discharging said capacitor, when the level of the input signal of said apparatus is the same as the level of the output signal of said apparatus.

6. The apparatus as set forth in claim 5, wherein said charging circuit comprises a first resistor and first and second transistors connected in series between a first power supply terminal and said capacitor, said first transistor being turned ON when the level of the input signal of said apparatus is not the same as the level of the output signal of said apparatus, said second transistor being turned ON when the output signal of said comparator is said first level, said discharging circuit comprising a second resistor and a third transistor connected in series between said capacitor and a second power supply terminal, said third transistor being turned ON when the output signal of said comparator is said second level, said rapid discharging circuit comprising a fourth transistor connected between said capacitor and said second power supply terminal, said fourth transistor being turned ON when the output signal of said coincidence circuit is at a level.

7. The apparatus as set forth in claim 6, wherein each of said first and second transistors comprises a P-channel MOS transistor, each of said third and fourth transistors comprising an N-channel MOS transistor.

8. The apparatus as set forth in claim 6, wherein said reference voltage generating circuit comprises:

third, fourth and fifth resistors connected in series between first and second power supply terminals; and fifth and sixth transistors, connected in series between terminals of said fourth resistor, for generating said variable reference voltage at a connection node of said fifth and sixth transistors, said fifth transistor being turned ON when the output signal of said comparator is a first level, said sixth transistor being turned ON when the output signal of said comparator is a second level.

9. The apparatus set forth in claim 8, wherein said fifth transistor comprises a P-channel MOS transistor and said sixth transistor comprises an N-channel MOS transistor.

10. The apparatus as set forth in claim 1, wherein said output signal generating circuit comprises a D-type flip-flop which fetches an inverted output signal of said D-type flip-flop in synchronization with an output signal of said counter.

11. A chattering eliminating apparatus comprising:

a coincidence circuit for receiving an input signal of said apparatus and an output signal of said apparatus to determine whether or not a level of the input signal of said apparatus is the same as a level of the output signal of said apparatus;

a capacitor;

a first resistor and first and second transistors connected in series between a first power terminal and said capacitor;

a second resistor and a third transistor connected in series between said capacitor and a second power supply terminal;

a fourth transistor connected between said capacitor and said second power supply terminal;

a comparator having a hysteresis characteristic, connected to said capacitor, for comparing a voltage level of said capacitor with a variable reference voltage;

a counter, connected to said comparator, for counting an output signal of said comparator; and a flip-flop, connected to said counter, for inverting the output signal of said apparatus when a counter value of said counter reaches a predetermined value, said first transistor being turned ON when the level of the input signal of said apparatus is not the same as the level of the output signal of said apparatus, said second transistor being turned ON when the output signal of said comparator is a first level, said third transistor being turned ON when the output signal of said comparator is a second level, said fourth transistor being turned ON when the level of the input signal of said apparatus is the same as the level of the output signal of said apparatus.

* * * * *

UNITED STATES PATENT AND TRADEMARK OFFICE
CERTIFICATE OF CORRECTION

PATENT NO.     : 6,873,216 B2
DATED          : March 29, 2005
INVENTOR(S)    : Shunichi Seya It is certified that error appears in the above-identified patent and that said Letters Patent is hereby corrected as shown below:

<u>Title page,</u>
Item [73], Assignee, should read -- NEC Electronics Corporation, Tokyo, Japan --.

Signed and Sealed this

Fifteenth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,873,216 B2  
APPLICATION NO. : 10/269248  
DATED : March 29, 2005  
INVENTOR(S) : Shunichi Seya It is certified that error appears in the above-identified patent and that said Letters Patent is hereby corrected as shown below:

Title page item 73 should read  
Assignee: NEC Electronics Corporation  
               Kanagawa, Japan Signed and Sealed this Fifth Day of February, 2008

JON W. DUDAS  
*Director of the United States Patent and Trademark Office*